United States Patent
Tanino

[19]

[11] Patent Number: 6,143,267
[45] Date of Patent: Nov. 7, 2000

[54] SINGLE CRYSTAL SIC AND A METHOD OF PRODUCING THE SAME

[75] Inventor: Kichiya Tanino, Sanda, Japan

[73] Assignee: Nippon Pillar Packing Co., Ltd., Osaka, Japan

[21] Appl. No.: 09/284,484

[22] PCT Filed: Aug. 5, 1998

[86] PCT No.: PCT/JP98/03480

§ 371 Date: Apr. 23, 1999

§ 102(e) Date: Apr. 23, 1999

[87] PCT Pub. No.: WO99/13139

PCT Pub. Date: Mar. 18, 1999

[30] Foreign Application Priority Data

Sep. 10, 1997 [JP] Japan .................................. 9-245432

[51] Int. Cl.[7] .............................. C01B 31/36; C30B 1/04
[52] U.S. Cl. .................................. 423/345; 117/1; 117/4; 117/7; 117/9; 117/88; 117/951
[58] Field of Search ........................... 428/446; 423/345; 117/1, 4, 7, 9, 88, 951

[56] References Cited

U.S. PATENT DOCUMENTS

| | | | |
|---|---|---|---|
| 5,915,194 | 6/1999 | Powell et al. | 438/478 |
| 6,053,973 | 6/1999 | Tanino et al. | 117/4 |

*Primary Examiner*—Benjamin L. Utech
*Assistant Examiner*—Donald L. Champagne
*Attorney, Agent, or Firm*—Jones, Tullar & Cooper, P.C.

[57] ABSTRACT

A complex (M) which is formed by growing a polycrystalline β-SiC plate 4 by the thermal CVD method on crystal orientation faces which are unified in one direction of plural plate-like single crystal α-SiC pieces 2 that are stacked and closely contacted is subjected to a heat treatment at a temperature in the range of 1,850 to 2,400° C., whereby a single crystal which is oriented in the same direction as the crystal axes of the single crystal α-SiC pieces 2 is grown from the crystal orientation faces of the single crystal α-SiC pieces toward the polycrystalline β-SiC plate 4. As a result, single crystal SiC of a high quality in which crystalline nuclei, impurities, micropipe defects, and the like are not substantially generated in an interface can be produced easily and efficiently.

18 Claims, 5 Drawing Sheets

SINGLE CRYSTAL SIC AND A METHOD OF PRODUCING THE SAME

TECHNICAL FIELD

The present invention relates to single crystal SiC and a method of producing the same, and more particularly to single crystal SiC which is used as a semiconductor substrate wafer for a light-emitting diode, an X-ray optical element such as a monochromater, a high-temperature semiconductor electronic element, a power device, or the like, and also to a method of producing the same.

BACKGROUND ART

SiC (silicon carbide) is superior in heat resistance and mechanical strength than an existing semiconductor material such as Si (silicon) and GaAs (gallium arsenide), and also has good high-temperature properties, high-frequency properties, dielectric strength, and resistance to environments. In addition, it is easy to perform the valence control of electrons and holes by doping an impurity. Moreover, SiC has a wide band gap (for example, single crystal 6H-SiC has a band gap of about 3.0 eV, and single crystal 4H-SiC has a band gap of 3.26 eV). For these reasons, single crystal SiC receives attention and is expected as a semiconductor material for a next-generation semiconductor material for a power device.

As a method of producing (growing) single crystal SiC of this type, conventionally, known are the Achison method which is generally known as an industrial method of producing an SiC abrasive material, and the sublimation and recrystallization method in which powder SiC produced by the Achison method is used as a raw material and a crystal is grown on a single crystalline nucleus.

In the Achison method of the above-described conventional production methods, however, a single crystal is grown slowly over a long time period, so that the crystal growth rate is very low. In addition, a large number of crystalline nuclei are generated in an initial growth stage, and they propagate to an upper portion of the crystal as the crystal growth advances. Thus, it is difficult to singly obtain a large-size single crystal.

In the sublimation and recrystallization method, a high-speed growth of about 1 mm/hr. is adopted mainly for an economical reason (production cost), so that impurities and pin holes which have a diameter of several microns and which pass through the crystal in the growing direction are likely to remain in a growing crystal. Such pin holes are called micropipe defects and cause a leakage current when a semiconductor device is fabricated. Accordingly, there exists a problem in that single crystal SiC having a sufficiently good quality cannot be obtained. This blocks a practical use of SiC which has many superior characteristics as compared with other existing semiconductor materials such as Si and GaAs as described above.

DISCLOSURE OF INVENTION

The invention has been conducted in view of the above-mentioned circumstances of the prior art. It is an object of the invention to provide single crystal SiC in which the crystal orientation can be easily specified, and which is large and has a very high quality, and a method of producing single crystal SiC in which the growing rate of single crystal SiC is made higher so that a single crystal having a high quality can be produced with a high productivity.

The single crystal SiC of the first invention is characterized in that a complex in which plural plate-like single crystal SiC pieces are stacked while crystal orientation faces of the SiC pieces are arranged in a substantially same plane and crystal orientations are unified into one direction, and a polycrystalline plate consisting of Si and C atoms is stacked on the crystal orientation faces of the plural stacked single crystal SiC pieces is subjected to a heat treatment, whereby a single crystal is grown from the crystal orientation faces of the plural single crystal SiC pieces toward the polycrystalline plate.

The method of producing single crystal SiC of the second invention is characterized in that plural plate-like single crystal SiC pieces are stacked while crystal orientation faces of the SiC pieces are arranged in a substantially same plane and crystal orientations are unified into one direction, and then secured by a sintered carbon jig, a polycrystalline plate consisting of Si and C atoms is stacked on the crystal orientation faces of the plural single crystal SiC pieces which are secured in a stacked state, and the complex is then subjected to a heat treatment, whereby a single crystal is grown from the crystal orientation faces of the plural single crystal SiC pieces toward the polycrystalline plate.

According to the thus configured first and second inventions, the property that, when plural plate-like single crystal SiC pieces are used in a stacked state, the crystal orientations of the plural single crystal SiC pieces are easily unified into one direction is effectively used, a polycrystalline plate consisting of Si and C atoms is stacked on the specified crystal orientation faces, and a heat treatment is thereafter conducted, with the result that all polycrystals of the polycrystalline plate are oriented by phase transformation in the same direction with respect to the crystal axes of the plural single crystal SiC pieces, thereby enabling the single crystals which are grown at a high speed toward the polycrystalline plate to be integrated. Therefore, high-quality single crystal SiC in which crystalline nuclei, impurities, micropipe defects, and the like are not generated in an interface, and which is thick can be efficiently grown. Thus, it is possible to attain an effect of expediting the practical use of single crystal SiC which is superior in high-temperature properties, high-frequency properties, dielectric strength, resistance to environments, and the like to existing semiconductor materials such as Si (silicon) and GaAs (gallium arsenide), and which is expected as a semiconductor material for a power device.

In the single crystal SiC of the first invention and the method of producing single crystal SiC of the second invention, when the crystal orientation faces of the plural single crystal SiC pieces for forming the complex are adjusted by a grinding or polishing process so as to have a surface roughness which is smaller than 1,000 angstroms RMS, particularly, in the range of 100 to 500 angstroms RMS, crystalline nuclei are sufficiently suppressed from being generated in the interface while the crystal orientation faces of the plural single crystal SiC pieces on which the polycrystalline plate is to be stacked can be easily processed into faces in which physical unevenness is small, thereby attaining an effect that the quality of single crystal SiC can be improved.

In the single crystal SiC of the first invention and the method of producing single crystal SiC of the second invention, when the polycrystalline plate for forming the complex is grown by the thermal chemical vapor deposition method and then polished so as to have a thickness of 300 to 700 $\mu$m, particularly, about 500 $\mu$m, a mismatch of a crystal lattice caused by lattice distortion of the crystal orientation faces of the plural single crystal SiC pieces can be eliminated by a heat treatment for a short time period, thereby attaining an effect that single crystal SiC having a high quality can be produced with a high productivity.

In the method of producing single crystal SiC of the second invention, under a state where the complex is accommodated in a carbon container and the outer side of the carbon container is surrounded and covered with SiC powder, the heat treatment of the complex may be performed at a temperature in a range of 1,850 to 2,400° C. In this configuration, when the polycrystalline plate is a polycrystalline β-SiC plate which is grown by the thermal chemical vapor deposition method, particularly, the heat treatment may be performed at a temperature in a range of 1,850 to 2,400° C. under a state where the surface of the β-SiC polycrystalline plate is polished, carbon is placed on the polished surface of the polycrystalline β-SiC plate, the complex is then accommodated in the carbon container, and the outer side of the carbon container is surrounded and covered with SiC powder. According to this configuration, the SiC powder which is placed in the high-temperature atmosphere during the heat treatment is decomposed, and at least part of decomposed Si and C is moved into the container through the carbon container, so that the heat treatment can be performed in a saturated SiC vapor atmosphere. Accordingly, degradation of the quality due to the decomposition of the single crystal SiC pieces and the polycrystalline plate can be suppressed, thereby attaining an effect that it is possible to surely produce single crystal SiC of a higher quality.

In the method of producing single crystal SiC of the third invention, the surface of the single crystal SiC which is produced by the production method of the second invention is again ground or polished, a polycrystalline plate is then stacked on the ground or polished surface of the single crystal SiC, and the complex is thereafter subjected to a heat treatment, whereby a single crystal is grown from a crystal orientation face of the single crystal SiC toward the polycrystalline plate.

According to the thus configured third invention, an effect is attained that single crystal SiC which has a high quality and also a very large thickness and which has wide applicability as a semiconductor material can be easily obtained.

BEST MODE FOR CARRYING OUT THE INVENTION

Figure 1:
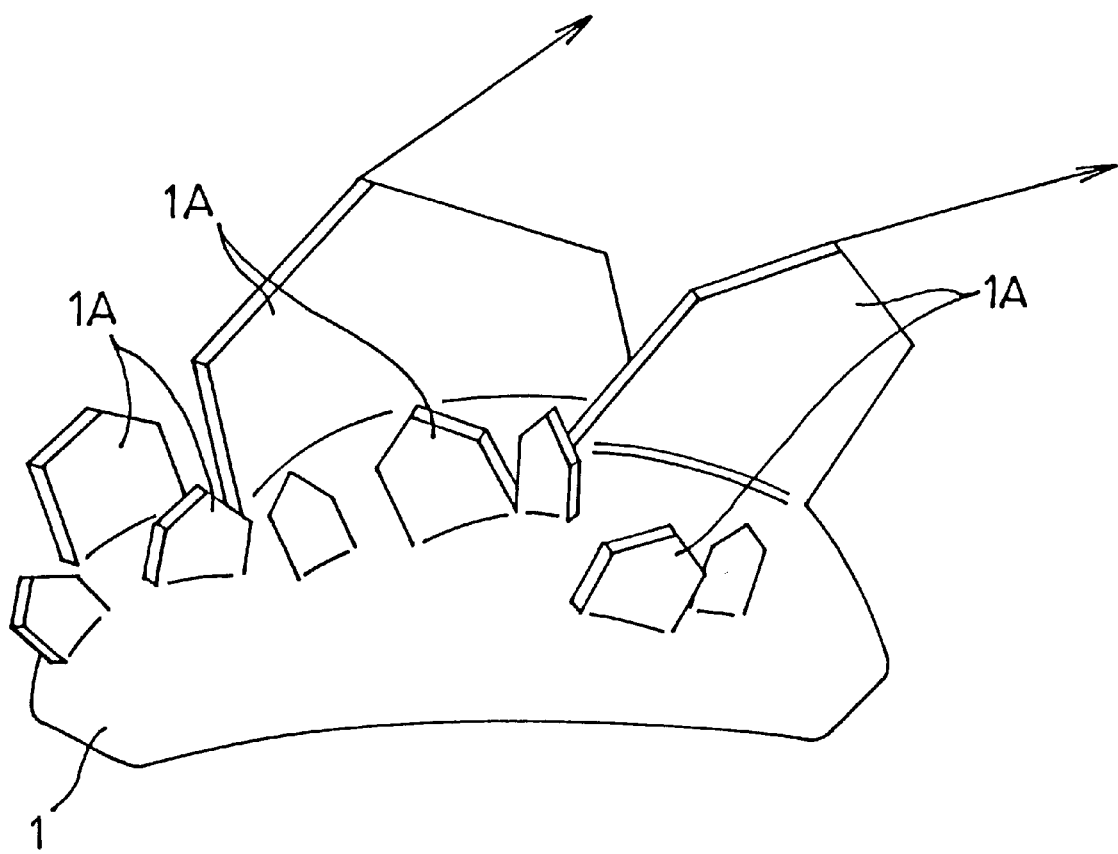
FIG. 1 is a schematic perspective view showing a single crystal α-SiC ingot which is used as a raw material of plate-like single crystal α-SiC pieces to be used in the method of producing single crystal SiC according to the invention, and which is produced by the Achison method.

Hereinafter, an embodiment will be described. FIGS. 1 to 9 sequentially illustrate production steps of the method of producing single crystal SiC according to the invention. In FIG. 1, 1 denotes a single crystal hexagonal α-SiC ingot (6H type or 4H type) which is produced by the Achison method. As shown by the arrow in FIG. 1, the single crystal α-SiC ingot 1 has many plate-like single crystal SiC pieces 1A of a wide variety of sizes, and is provided with a feature that the crystal orientation can be easily specified.

Figure 2:
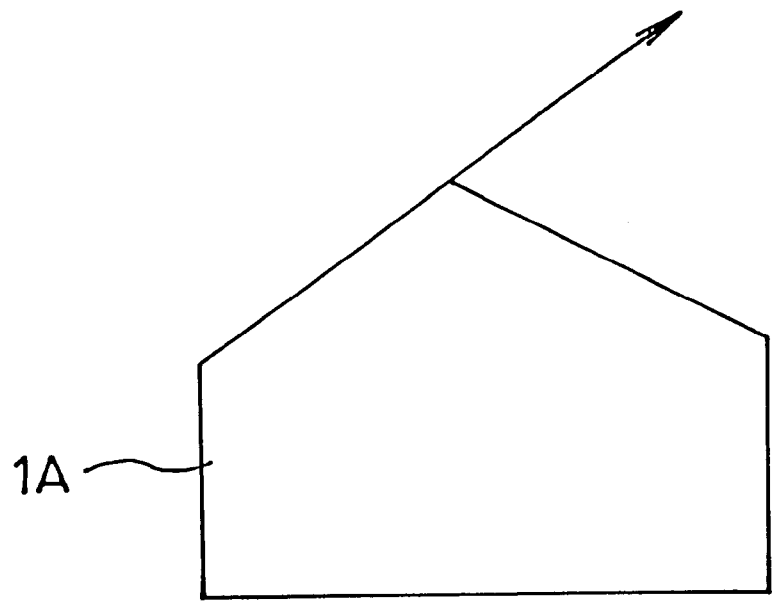
FIG. 2 is a front view of a plate-like single crystal α-SiC piece which is cut out from the single crystal α-SiC ingot.
Figure 3:
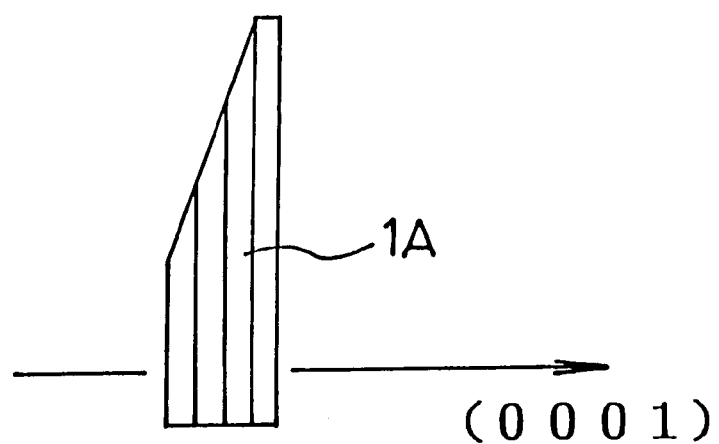
FIG. 3 is a side view of the plate-like single crystal α-SiC piece.
Figure 4:
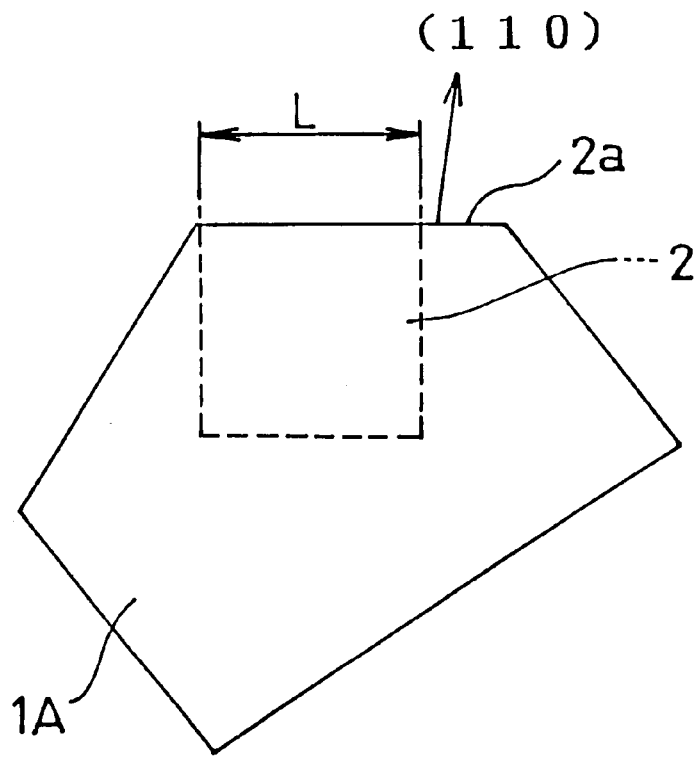
FIG. 4 is a front view of a single crystal α-SiC piece which is cut out from the plate-like single crystal α-SiC piece and in which the size is adjusted.
Figure 5:
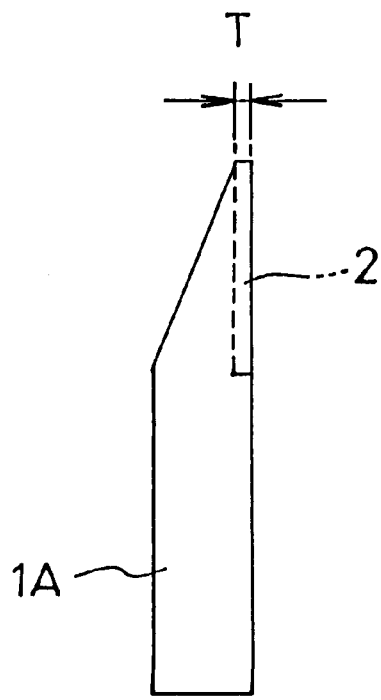
FIG. 5 is a side view of the single crystal α-SiC piece.

As shown in FIGS. 2 and 3, thereafter, many plate-like single crystal SiC pieces 1A are cut out from the single crystal α-SiC ingot 1. As shown in FIGS. 4 and 5, from the plate-like single crystal SiC pieces 1A, rectangular plate-like single crystal α-SiC pieces 2 in which the length L of one edge is about 1 cm and the thickness T is about 0.5 mm are then cut out along the (110) crystal orientation faces 2a, and the crystal orientation faces 2a are polished so that the pieces are adjusted so as to have the same size.

Figure 6:
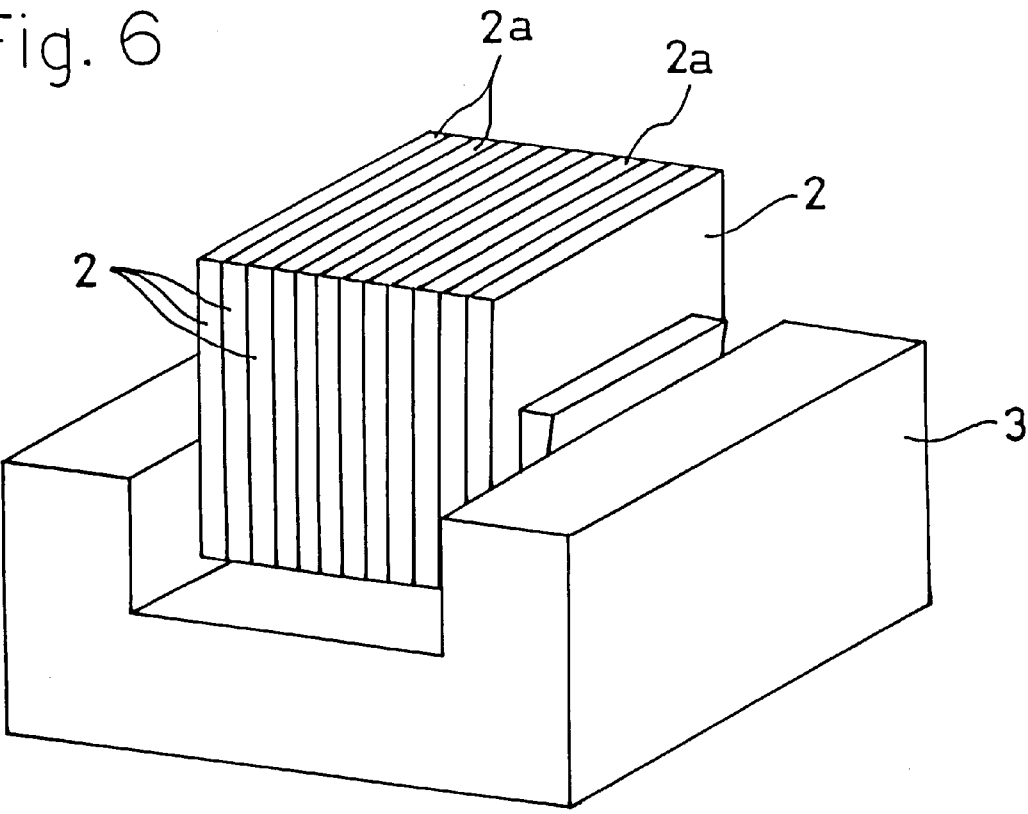
FIG. 6 is a schematic perspective view showing a state where a plurality of the single crystal α-SiC pieces are secured in a stacked and closely contacted state.

As shown in FIG. 6, thereafter, a plurality, for example, about 20 pieces of the single crystal α-SiC pieces 2 which are adjusted in size as described above are secured to a sintered carbon jig 3 while they are arranged with setting their crystal orientation faces 2a to be in a substantially same plane and the faces of the C-axis direction, i.e., (0001) faces are stacked and closely contacted with one another so that the crystal orientations are unified into one direction. The crystal orientation faces 2a of the plural single crystal α-SiC pieces 2 which are secured to the sintered carbon jig 3 are subjected to a grinding or polishing process so that physical unevenness is eliminated.

More specifically, the crystal orientation faces 2a are adjusted so as to have a surface roughness which is smaller than 1,000 angstroms RMS, preferably, in the range of 100 to 500 angstroms RMS.

Figure 7:
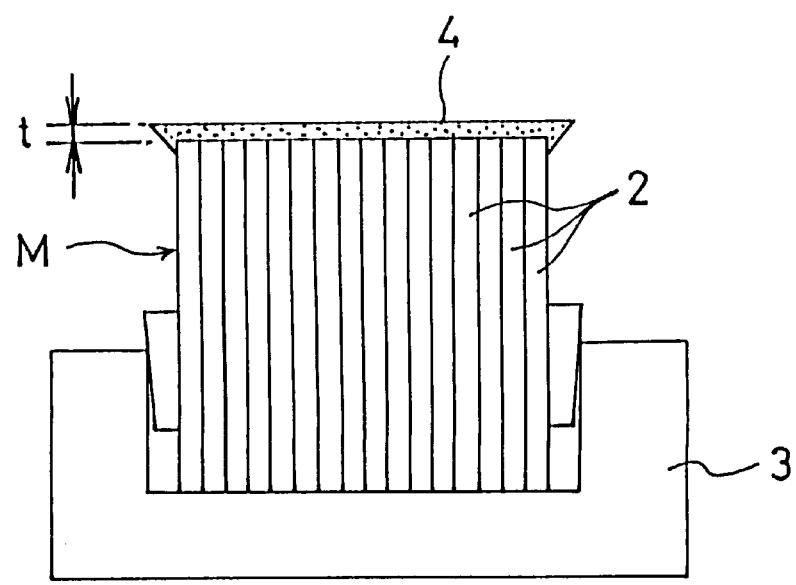
FIG. 7 is a schematic side view showing a state where a polycrystalline β-SiC plate is grown by the thermal chemical vapor deposition method on crystal orientation faces of the plural single crystal α-SiC pieces which are stacked and closely contacted.

As shown in FIG. 7, thereafter, a β-SiC plate 4 is formed on the crystal orientation faces 2a of the plural single crystal α-SiC pieces 2 which are stacked and closely contacted with one another, by the thermal chemical vapor deposition method (hereinafter, referred to as the thermal CVD method). After the growth by the thermal CVD method, the surface of the β-SiC plate 4 is polished so that the thickness t becomes 300 to 700 μm, preferably, about 500 μm.

Figure 8:
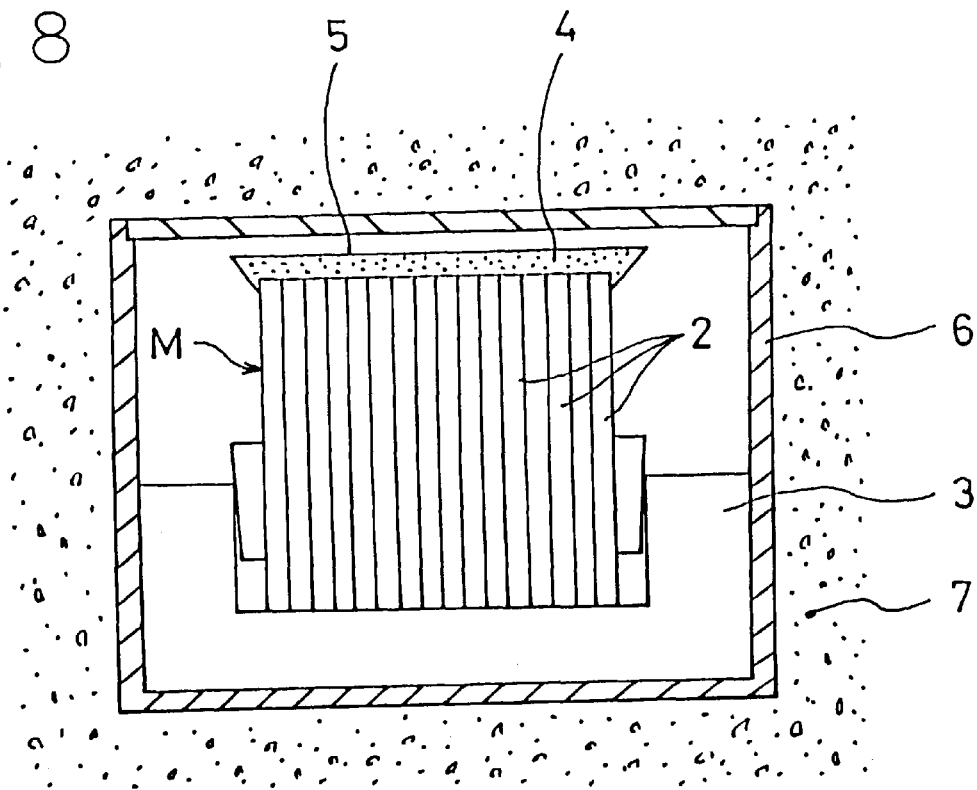
FIG. 8 is a schematic side view showing a heat treatment state of a complex.
Figure 9:
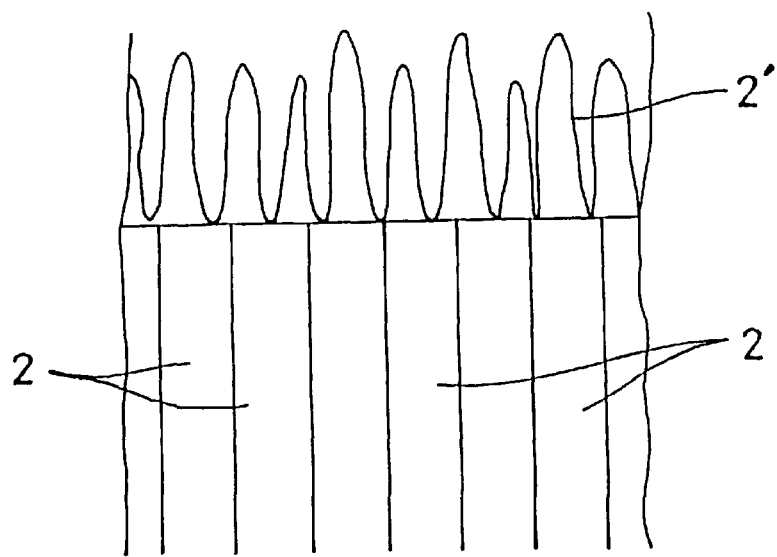
FIG. 9 is an enlarged side view of main portions and showing a state where single crystal SiC is grown by a heat treatment.

Next, carbon 5 is placed on the polished surface of the β-SiC plate 4 of a complex M consisting of the plural single crystal α-SiC pieces 2 and the β-SiC plate 4. As shown in FIG. 8, thereafter, under a state where the complex M is accommodated in a carbon container 6 and the outer side of the carbon container 6 is surrounded and covered with α-SiC powder 7, the complex is heat-treated while it is held for about 20 hours at a temperature of 1,850 to 2,400° C., preferably, 2,200° C. As a result, as shown in FIG. 9, single crystal α-SiC 2' which is oriented in the same direction as the crystal axes of the single crystal α-SiC pieces 2 is integrally grown from each of the crystal orientation faces 2a of the single crystal α-SiC pieces 2 toward the β-SiC plate 4.

The single crystal SiC which was produced by the above-described production steps was cooled, and the surface of the single crystal was then polished and etched by molten potassium hydroxide (KOH). The surface was then magnified and observed under a Nomarski microscope, with the result that no grain boundary was found and etch pits in the same direction as a hexagon were seen. From this, it was noted that single crystal α-SiC was grown.

As described above, when the plural single crystal α-SiC pieces 2 which are cut out into a rectangular plate like shape from the single crystal α-SiC ingot 1 produced by the Achison method are used in a stacked and closely contacted state, the crystal orientations of the plural single crystal α-SiC pieces 2 can be easily specified into one direction. When the complex M which is configured by forming the β-SiC plate 4 on the specified crystal orientation faces 2a is heat-treated, the single crystals 2' all of which are grown at a high speed toward the β-SiC plate 4 with being oriented in the same direction with respect to the crystal axes of the plural single crystal SiC pieces 2 can be integrated by recrystallization of polycrystals of the β-SiC plate 4. According to this configuration, high-quality single crystal SiC in which crystalline nuclei, impurities, micropipe defects, and the like are not generated in an interface, and which is thick can be efficiently produced.

Particularly, it is preferable to adjust the crystal orientation faces 2a of the plural single crystal α-SiC pieces 2 by a grinding or polishing process so as to have a surface roughness which is smaller than 1,000 angstroms RMS, preferably, in the range of 100 to 500 angstroms RMS. The employment of the adjustment of the surface roughness enables high-quality single crystal SiC in which a mismatch of a crystal lattice is eliminated and crystalline nuclei and the like are not generated in an interface, to be obtained although less process labor is consumed. Namely, physical unevenness of the crystal orientation faces 2a of the single crystal α-SiC pieces 2 on which the β-SiC plate 4 is grown by the thermal CVD method is preferably as small as possible because crystalline nuclei are less generated. However, a process of attaining a surface roughness which is smaller than 100 angstroms RMS requires much labor and a long time period. When the surface becomes rough or the surface roughness exceeds 1,000 angstroms RMS, phase transformation occurs simultaneously from a bottom face and a side face of a concave portion in a heat treatment. Therefore, the possibility of eliminating a mismatch of a crystal lattice is lowered, resulting in a low-quality product in which crystalline nuclei are generated in an interface.

Preferably, the β-SiC plate 4 is polished so that the thickness t after growth is 300 to 700 μm, more preferably, about 500 μm. When the plate is polished after growth in this way, a mismatch of a crystal lattice caused by lattice distortion can be eliminated by a heat treatment for a relatively short time period, and the productivity of single crystal SiC of a higher quality can be improved. This will be described below. When the β-Sic plate 4 is a thick film which is thicker than 700 μm, phase transformation occurs during a heat treatment while lattice distortion of the original crystal is maintained. In order to eliminate lattice distortion, therefore, a heat treatment for a long term is required, thereby producing a fear that the productivity of single crystal SiC of a higher quality is lowered. A mismatch of a crystal lattice caused by lattice distortion in the crystal orientation faces 2a of the plural single crystal α-SiC pieces 2 which serve as the foundation of the β-SiC plate 4 tends to be suddenly eliminated in the range of about 300 to 700 μm of the thickness from the single crystal α-SiC pieces. When the thickness exceeds 700 μm, the degree of elimination of a mismatch of a crystal lattice is reduced.

In the heat treatment of the complex M, the surface of the β-Sic plate 4 after the growth is polished, the carbon 5 is placed on the polished surface, under a state where the complex M is accommodated in the carbon container 6 and the outer side of the carbon container 6 is surrounded and covered with the α-SiC powder 7, the complex is subjected to a predetermined heat treatment. According to this configuration, the α-SiC powder 7 is decomposed in a high-temperature atmosphere, and at least part of decomposed Si and C is moved into the container 6 through the porous carbon container 6, so that the predetermined heat treatment can be performed in a saturated SiC vapor atmosphere. Accordingly, the decomposition of the single crystal α-SiC pieces 2 and the β-SiC plate 4 can be suppressed, whereby single crystal SiC of a high quality can be produced and Si and C which are moved into the container 6 through the porous carbon container 6 are prevented from adhering to SiC before phase transformation. As a result, it is possible to produce single crystal SiC which has a high quality and is beautiful.

When steps of again grinding or polishing the surface of the single crystal SiC which is produced as a result of the above-mentioned steps, and forming the β-Sic plate 4 on the polished surface by the thermal CVD method, and the heat treatment of the complex M including the β-SiC plate 4 are repeated, it is possible to obtain single crystal SiC having a large thickness along the crystal orientation. When stacked single crystal α-SiC pieces 2 are juxtaposed, the β-SiC plate 4 is formed on the whole area of the crystal orientation faces 2a of the group of the juxtaposed stacked single crystal α-SiC pieces 2 by the thermal CVD method, and the abovementioned heat treatment is then conducted, it is possible to obtain single crystal SiC which is large also in the term of area.

In the embodiment, the plate-like single crystal α-SiC pieces 2 are used as the single crystal SiC pieces. Alternatively, for example, plate-like crystal pieces such as α-SiC sintered members or single crystal β-SiC members may be used. In the embodiment, the crystalline β-SiC plate 2 which is grown on the crystal orientation faces 2a of the plural single crystal α-SiC pieces 2 by the thermal CVD is used as the polycrystalline plate. Alternatively, for example, a polycrystalline α-SiC plate, an SiC sintered member of high purity, or an amorphous plate of high purity ($10^{14 atm}$/$cm^3$) or less may be used, and it is possible to obtain single crystal SiC of a high quality in the same manner as the embodiment.

As the single crystal α-SiC pieces 2 in the embodiment, either of the 6H type or the 4H type may be used. When the 6H type is used, a single crystal which is converted from polycrystals of the polycrystalline β-SiC plate 2 into α-SiC as the progress of the heat treatment is easily grown in the same form as that of a single crystal of the 6H type. When single crystal pieces of the 4H type are used, a single crystal in the same form as that of a single crystal of the 4H type is easily converted and grown.

INDUSTRIAL APPLICABILITY

As described above, the invention is a technique that a complex in which a polycrystalline plate consisting of Si and C atoms is stacked on crystal orientation faces of plural plate-like single crystal SiC pieces that are stacked and closely contacted while crystal orientations are unified into one direction is subjected to heat treatment, so that a single crystal which is oriented in the same direction as the crystal axes of the single crystal pieces is integrally grown from the crystal orientation faces of the single crystal SiC pieces toward the polycrystalline plate, whereby high-quality single crystal SiC in which crystalline nuclei, impurities, micropipe defects, and the like are not generated in an interface, and which is thick can be efficiently produced.

What is claimed is:

1. Single crystal SiC characterized in that a complex in which plural plate-like single crystal SiC pieces are stacked while crystal orientation faces of said SiC pieces are arranged in a substantially same plane and crystal orientations are unified into one direction, and a polycrystalline plate consisting of Si and C atoms is stacked on the crystal orientation faces of said plural stacked single crystal SiC pieces is subjected to a heat treatment, whereby a single crystal is grown from the crystal orientation faces of said plural single crystal SiC pieces toward said polycrystalline plate.

2. Single crystal SiC according to claim 1, wherein said plural single crystal SiC pieces for forming said complex are single crystal α-SiC.

3. Single crystal SiC according to claim 1, wherein said polycrystalline plate for forming said complex is a polycrystalline β-SiC plate which is grown by a thermochemical vapor deposition method on the crystal orientation faces of said plural single crystal SiC pieces, the crystal orientation faces being arranged in a substantially same plane.

4. Single crystal SiC according to claim 1, wherein the crystal orientation faces of said plural single crystal SiC pieces for forming said complex are adjusted by a grinding or polishing process so as to have a surface roughness which is smaller than 1,000 angstroms RMS.

5. Single crystal SiC according to claim 4, wherein the crystal orientation faces of said plural single crystal SiC pieces for forming said complex are adjusted by a grinding or polishing process so as to have a surface roughness in a range of 100 to 500 angstroms RMS.

6. Single crystal Sic according to claim 3, wherein a Surface of said polycrystalline β-SiC plate which is grown by the thermochemical vapor deposition method is polished so as to have a thickness of 300 to 700 μm.

7. Single crystal SiC according to claim 6, wherein the surface of said polycrystalline β-Sic plate which is grown by the thermochemical vapor deposition method is polished so as to have a thickness of about 500 μm.

8. A method of producing single crystal SiC characterized in that plural plate-like single crystal SiC pieces are stacked while crystal orientation faces of said single crystal SiC pieces are arranged in a substantially same plane and crystal orientations are unified into one direction, and then secured by a sintered carbon jig, a polycrystalline plate consisting of Si and C atoms is stacked on the crystal orientation faces of said plural single crystal SiC pieces which are secured in a stacked state, and said complex is then subjected to a heat treatment, whereby a single crystal is grown from the crystal orientation faces of said plural single crystal SiC pieces toward said polycrystalline plate.

9. A method of producing single crystal SiC according to claim 8, wherein single crystal α-SiC is used as said plural single crystal SiC pieces for forming said complex.

10. A method of producing single crystal SiC according to claim 8, wherein a polycrystalline β-SiC plate which is grown by a thermochemical vapor deposition method on the crystal orientation faces of said plural single crystal SiC pieces is used as said polycrystalline plate for forming said complex, the crystal orientation faces being arranged in a substantially same plane.

11. A method of producing single crystal SiC according to claim 8, wherein the crystal orientation faces of said plural single crystal SiC pieces for forming said complex are adjusted by a grinding or polishing process so as to have a surface roughness which is smaller than 1,000 angstroms RMS.

12. A method of producing single crystal SiC according to claim 11, wherein the crystal orientation faces of said plural single crystal SiC pieces for forming said complex are adjusted by a grinding or polishing process so as to have a surface roughness in a range of 100 to 500 angstroms RMS.

13. A method of producing single crystal SiC according to claim 10, wherein a surface of said polycrystalline β-SiC plate which is grown by the thermochemical vapor deposition method is polished so as to have a thickness of 300 to 700 μm.

14. A method of producing single crystal SiC according to claim 13, wherein the surface of said polycrystalline β-SiC plate which is grown by the thermochemical vapor deposition method is polished so as to have a thickness of about 500 μm.

15. A method of producing single crystal SiC according to claim 9, wherein single crystal α-SiC pieces which are cut out in a plate-like shape from a single crystal α-SiC ingot along a crystal orientation face and which are adjusted so as to have the same size are used as said plural single crystal SiC pieces for forming said complex.

16. A method of producing single crystal SiC according to claim 8, wherein the heat treatment of said complex is performed at a temperature in a range of 1,850 to 2,400° C. under a state where said complex is accommodated in a carbon container, and an outer side of said carbon container is surrounded and covered with SiC powder.

17. A method of producing single crystal SiC according to claim 10, wherein the heat treatment of said complex is performed at a temperature in a range of 1,850 to 2,400° C. under a state where a surface of said β-SiC polycrystalline plate which is grown by the thermochemical vapor deposition method is polished, carbon is placed on the polished surface of said polycrystalline β-SiC plate, said complex is then accommodated in a carbon container, and an outer side of said carbon container is surrounded and covered with SiC powder.

18. A method of producing single crystal SiC wherein, after the surface of said single crystal SiC which is produced by the method according to claim 8 is again ground or polished, a polycrystalline plate is stacked on the ground or polished surface of said single crystal SiC, and said complex is thereafter subjected to a heat treatment, whereby a single crystal is grown from a crystal orientation face of said single crystal SiC toward said polycrystalline plate.

\* \* \* \* \*